United States Patent
Kato

[11] Patent Number: 5,900,926
[45] Date of Patent: May 4, 1999

[54] PROJECTION EXPOSURE APPARATUS

[75] Inventor: Kinya Kato, Yokohama, Japan

[73] Assignee: Nikon Corporation, Tokyo, Japan

[21] Appl. No.: 08/725,255

[22] Filed: Oct. 4, 1996

[30] Foreign Application Priority Data

Oct. 6, 1995 [JP] Japan .................................. 7-286431

[51] Int. Cl.⁶ ................................................. G03B 27/52
[52] U.S. Cl. .............................. 355/53; 355/55; 250/548; 356/400
[58] Field of Search ................................... 355/43–45, 53, 355/67, 68; 356/400, 401, 124; 430/30; 250/548

[56] References Cited

U.S. PATENT DOCUMENTS

| | | | |
|---|---|---|---|
| 4,037,969 | 7/1977 | Feldman et al. | 356/400 |
| 4,425,037 | 1/1984 | Hershel et al. | 355/43 |
| 4,690,528 | 9/1987 | Tanimoto et al. | 353/101 |
| 4,806,774 | 2/1989 | Lin et al. | 250/550 |
| 4,871,237 | 10/1989 | Anzai et al. | 350/419 |
| 5,246,803 | 9/1993 | Hanrahan et al. | 430/27 |
| 5,319,444 | 6/1994 | Saitoh et al. | 356/401 |

FOREIGN PATENT DOCUMENTS

| | | |
|---|---|---|
| 49-35453 | 9/1979 | Japan . |
| 60-28613 | 2/1985 | Japan . |
| 60-79357 | 5/1985 | Japan . |
| 3-13574 | 2/1991 | Japan . |
| 7-57986 | 3/1995 | Japan . |

Primary Examiner—D. Rutledge
Attorney, Agent, or Firm—Foley & Lardner

[57] ABSTRACT

A projection exposure apparatus performs focus adjustment to correct variations in the focal position of a projection optical system which are caused by absorption of exposure light by a refraction system in the projection optical system. The projection optical system arranged in this projection exposure apparatus includes a refraction system having a positive refracting power, and a reflecting mirror positioned to be coaxial with the refraction system. The projection exposure apparatus includes a photodetection device for detecting light, of light emitted from an illumination optical system and transmitted through a first substrate, which is transmitted through the reflecting mirror, and an adjustment device for adjusting the in-focus state between the first substrate, a second substrate, and the projection optical system in accordance with an output from the photodetection device.

20 Claims, 5 Drawing Sheets

PROJECTION EXPOSURE APPARATUS

BACKGROUND OF THE INVENTION

1. Field of the Invention

The present invention relates to a projection exposure apparatus and, more particularly, to focus adjustment with respect to variations in the focal position of a projection optical system having a refraction system.

2. Related Background Art

An integral scanning exposure apparatus using a one-to-one projection optical system including a refraction system and a plane mirror is disclosed in Japanese Patent Publication No. 49-35453. In the projection exposure apparatus disclosed in Japanese Patent Laid-Open No. 7-57986, a projection optical system is constituted by a plurality of one-to-one erect projection optical units each consisting of two partial optical systems each including a refraction system and a concave reflecting mirror. A mask and a plate are moved relatively to this projection optical system to perform full-wafer scanning exposure.

In the above conventional technique, a lens as a part of each refraction system in the projection optical system absorbs exposure light during an exposure process. As a result, the temperature of the lens rises, and the focal position of the projection optical system varies. When a projection optical system constituted by a plurality of projection optical units is to be used, in particular, since the pattern densities (average transmittances) of mask pattern regions corresponding to the respective projection optical units differ from each other, the densities of energy passing through the respective projection optical units differ from each other. For this reason, the temperatures of the refraction systems of the respective projection optical units rise differently, and the focal positions of the respective projection optical units differ from each other.

SUMMARY OF THE INVENTION

It is an object of the present invention to provide a projection exposure apparatus which can perform focus adjustment with respect to variations in the focal position of a projection optical system which are caused by absorption of exposure light by a refraction system in the projection optical system.

According to the present invention, a projection exposure apparatus includes an illumination optical system for illuminating a first substrate on which a pattern is formed, and a projection optical system for forming an image of the pattern formed on the first substrate on a second substrate. The projection optical system is characterized by comprising a refraction system having a positive refracting power, and a reflecting mirror positioned to be coaxial with the refraction system, photodetection means for detecting light, of light emitted from the illumination optical system and transmitted through the first substrate, which is transmitted through the reflecting mirror, and adjustment means for adjusting an in-focus state between the first and second substrates and the projection optical system in accordance with an output from the photodetection means.

The adjustment means preferably moves at least one of the first and second substrates relatively to the projection optical system in accordance with a variation in focal position of the projection optical system which is obtained on the basis of the output from the photodetection means.

Alternatively, the adjustment means preferably adjusts the focal position of the projection optical system to correct a variation in the focal position of the projection optical system which is obtained on the basis of the output from the photodetection means.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The reflecting surface of a reflecting mirror in a projection optical system is formed by, for example, depositing a dielectric multilayered film. For this reason, exposure light transmitted through a mask as a first substrate is partly transmitted through the reflecting mirror in the projection optical system. In the present invention, of exposure light emitted from an illumination optical system and transmitted through the mask, light transmitted through the reflecting mirror is detected.

Since the amount of light transmitted through the reflecting mirror, i.e., leakage light, is proportional o to the average transmittance of the mask, the amount of light passing through the projection optical system can be detected by measuring the intensity of the leakage light. The relationship between the amount of light passing through the projection optical system (i.e., the refraction system) and the focal position variation amount of the projection optical system is unique to the arrangement of the projection exposure apparatus, and can be obtained in advance by actual measurement or the like.

In the present invention, therefore, a variation in the focal position of the projection optical system is obtained on the basis of the intensity of leakage light, and the in-focus state between the mask, the plate (second substrate), and the projection optical system can be adjusted in accordance with the obtained focal position variation. According to the present invention, by adjusting the in-focus state while monitoring the intensity of leakage light, projection exposure can always be performed with good imaging performance.

In adjusting the in-focus state, at least one of the mask and the plate may be moved relatively to the projection optical system. Alternatively, the focal position of the projection optical system may be adjusted to correct the focal position variation.

Consider a projection exposure apparatus in which a projection optical system is constituted by a first partial optical system for forming an intermediate image of a mask pattern, and a second partial optical system for re-forming the intermediate image on the plate. In this apparatus, it suffices to detect light transmitted through at least one of the reflecting mirrors in the first and second partial optical systems.

Consider a projection exposure apparatus in which a projection optical system is constituted by a plurality of telecentric projection optical units each serving to form a one-to-one image of a mask pattern. In this apparatus, it suffices to detect light transmitted through a reflecting mirror in each projection optical unit. In this case, the focal position variation amounts of the respective projection optical units differ from each other in accordance with the transmittances of mask pattern portions corresponding to the respective projection optical units. In order to correct these variation amounts, at least one of the mask and the plate may be moved to the average focal position of the respective projection optical units, or the focal positions of the respective projection optical units may be adjusted.

Embodiments of the present invention will be described below with reference to the accompanying drawings.

Figure 1:
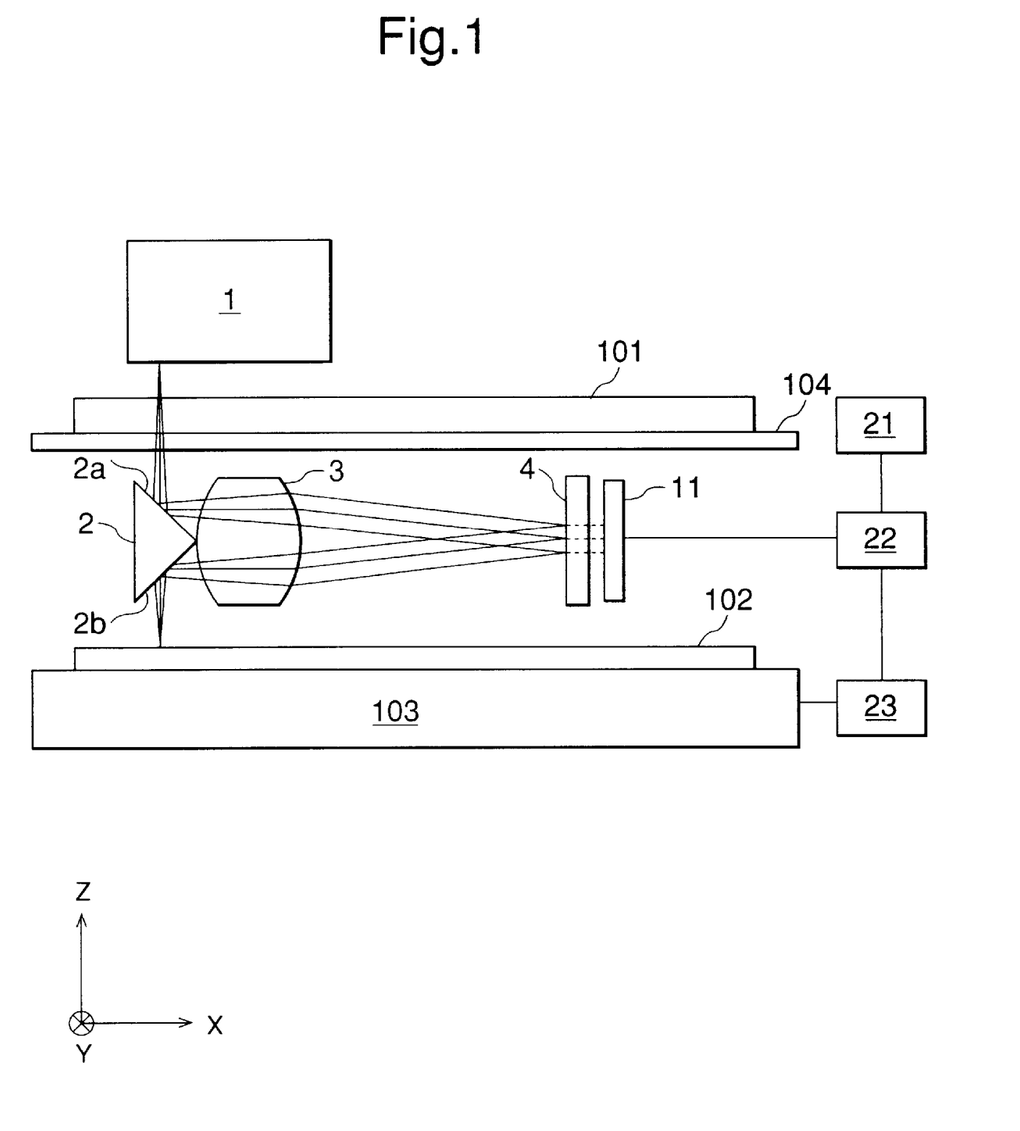
FIG. 1 is a view showing the arrangement of a projection exposure apparatus according to the first embodiment of the present invention.

FIG. 1 shows the arrangement of a projection exposure apparatus according to the first embodiment of the present invention. Referring to FIG. 1, a direction parallel to the drawing surface within the plane of a plate 102 (second substrate) made of a glass substrate coated with, e.g., a resist is defined as the X-axis; a direction perpendicular to the drawing surface, the Y-axis; and a direction normal to the plate 102, the Z-axis.

The projection exposure apparatus in FIG. 1 includes an illumination optical system 1 for illuminating a mask 101 (first substrate) on which a transfer pattern is formed. Exposure light transmitted through the mask 101 supported to be parallel to the X-Y plane is reflected by a first reflecting surface 2a of a prism 2 in the X direction. The light is then incident on a positive lens 3. The light transmitted through the positive lens 3 is reflected by a plane reflecting mirror 4 and incident on the positive lens 3 again. Note that since the plane reflecting mirror 4 is positioned to the focal position of the positive lens 3, the position of the plane reflecting mirror 4 corresponds to the position of an aperture stop.

The light transmitted through the positive lens 3 is reflected by a second reflecting mirror 2b of the prism 2 in the Z direction and reaches the plate 102.

As a result, a one-to-one image of the pattern of the mask 101 is formed on the plate 102.

As described above, the prism 2, the positive lens 3, and the plane reflecting mirror 4 constitute a projection optical system for forming a one-to-one image of a mask pattern.

The plate 102 is supported on a stage 103, which can move in the X and Z directions, to be parallel to the X-Y plane. The mask 101 is also supported on a stage 104, which can move in the X direction, to be parallel to the X-Y plane.

Therefore, the pattern formed on the mask 101 can be scanned/exposed on the entire exposure region on the plate 102 altogether by moving the mask 101 and the plate 102 in the X direction (scanning direction) relatively to the projection optical system.

For example, the reflecting surface of the plane reflecting mirror 4 is made of a dielectric multilayered film. For this reason, exposure light incident on the plane reflecting mirror 4 is partly transmitted through the plane reflecting mirror 4. The exposure light transmitted through the plane reflecting mirror 4, i.e., leakage light, is detected by a photodetector 11. An output signal from the photodetector 11 is supplied to a control system 22.

The projection exposure apparatus in FIG. 1 includes a data table 21 indicating the relationship between the amount of leakage light and the focal position variation amount of the projection optical system. Note that the relationship between the amount of leakage light and the focal position variation amount of the projection optical system is unique to the arrangement of the projection exposure apparatus (i.e., the projection optical system), and can be obtained in advance by an experiment or the like.

The control system 22 can therefore obtain the focal position variation amount of the projection optical system by referring to the data table 21 in accordance with an output signal from the photodetector 11. The control system 22 supplies a driving signal to a driving system 23 on the basis of the obtained focal position variation amount, thereby moving the stage 103, i.e., the plate 102, in the Z direction by a required amount in accordance with the driving signal. In this manner, the in-focus state between the mask 101, the plate 102, and the projection optical system can be adjusted to correct the variation in the focal position of the projection optical system which is caused by absorption of exposure light by the positive lens 3.

Note that the projection optical system in the first embodiment is a two-side telecentric optical system. Therefore, the in-focus state with respect to the projection optical system can also be adjusted by moving the mask 101 in the Z direction. In addition, by moving both the mask 101 and the plate 102 in the Z direction, the in-focus state with respect to the projection optical system can be adjusted.

Furthermore, the focal position of the projection optical system may be adjusted to correct a variation in the focal position of the projection optical system which is caused by absorption of exposure light by the positive lens 3. Note that the focal position of the projection optical system is adjusted by controlling the pressure in the lens housing or shifting the lens.

An example of the data table 21 will be described below.

According to Japanese Patent Laid-Open No. 60-79357, a focal position F of the projection optical system is a function of an atmospheric pressure $p_a$, an atmospheric temperature T, a temperature $T_L$ of the lens, and a pressure p in the lens housing, and is given by equation (1):

$$F = (p_a, T, T_L, p) \qquad (1)$$

In general, however, the lens is constituted by a plurality of lenses. In the strict sense, therefore, as the temperature $T_L$ of the lens, temperatures $T_{iL}$ of the plurality of lenses must be set. Instead of setting such temperatures, in the present invention, the focal position F is regarded as a function of a leakage light amount E and an elapsed time t, and is given by equation (2):

$$F = (p_a, T, E, t, p) \qquad (2)$$

Total differentiation of equation (2) gives equation (3):

$$dF = (\partial f/\partial p_a)dp_a + (\partial f/\partial T)dT + (\partial f/\partial E)dE + \\ (\partial f/\partial t)dt + (\partial f/\partial p)dp \\ \equiv C_1 dp_a + C_2 dT + C_3 dE + C_4 dt + C_5 dp \quad (3)$$

The coefficient $C_1$ in equation (3) is a value obtained by an experiment or the like in advance. The meanings of the coefficients $C_3$ and $C_4$ will be briefly described below. The coefficient $C_3$ is proportional to the amount of leakage light. The coefficient $C_4$ is associated with heat radiation with the lapse of time, and has an opposite sign to the coefficient $C_3$ as long as the temperature of the lens is equal to or higher than the atmospheric temperature T.

In order to correct the movement of the focal point of the projection optical system due to a leakage light amount and light absorption in an exposure process, equation (3)=0 is set and solved with respect to dp. As a result, equation (4) is given:

$$dp = -(C_1 dp_a + C_2 dT + C_3 dE + C_4 dt)/C_5 \quad (4)$$

Focus correction can be performed by changing the pressure in the lens housing according to equation (4). In this case, the values of $dp_a$, dT, dE, and dt, and the value of dp calculated from these values according to equation (4) are written in the data table 21. If the focal point is to be moved without performing pressure control, dp=0 may be set in equation (3), and dF may be calculated.

As the dielectric multilayered film formed on the reflecting surface of the plane reflecting mirror 4, for example, a combination of Zns and $Na_3AlF_6$ (cryolite) can be used, as disclosed in Tadao Tsuruta, "Applied Optics II", p. 130. The absorptance of the dielectric multilayered film made of this combination is about 0.1% in the visible range.

As the photodetector, a photoelectric conversion element, more specifically, a photomultiplier, a photodiode, a phototransistor, or the like can be used.

Figure 2:
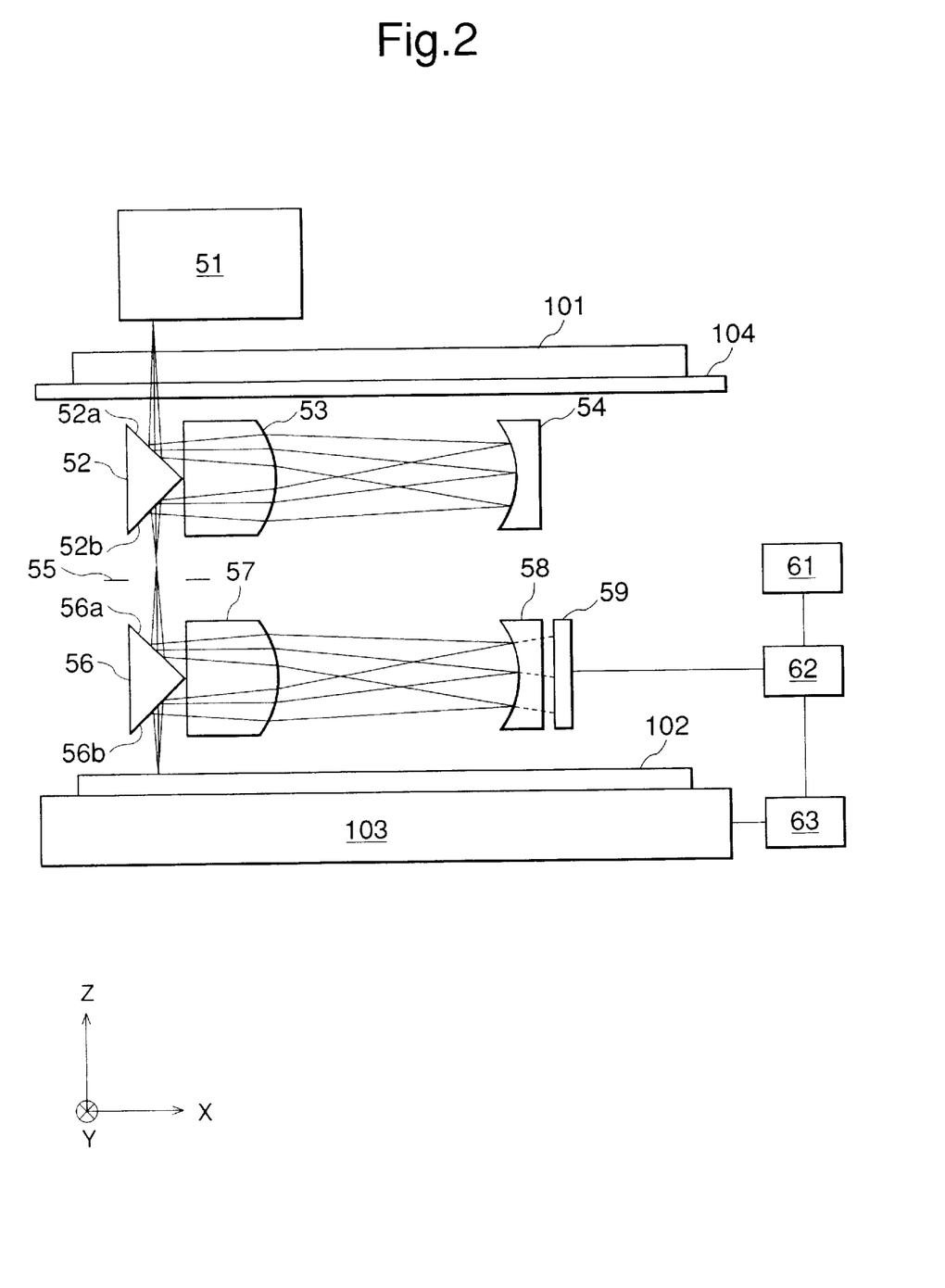
FIG. 2 is a view showing the arrangement of a projection exposure apparatus according to the second embodiment of the present invention.

FIG. 2 shows the arrangement of a projection exposure apparatus according to the second embodiment of the present invention. The projection optical system of the projection exposure apparatus in FIG. 2 comprises a first partial optical system (52 to 54), a field stop 55, and a second partial optical system (56 to 68). The first partial optical system (52 to 54) has the same arrangement as that of the second partial optical system (56 to 58).

Referring to FIG. 2, a direction parallel to the drawing surface within the plane of a plate 102 (second substrate) is defined as the X-axis; a direction perpendicular to the drawing surface, the Y-axis; and a direction normal to the plate 102, the Z-axis.

The projection exposure apparatus in FIG. 2 includes an illumination optical system 51 for illuminating a mask 101 on which a transfer pattern is formed. Exposure light transmitted through the mask 101 supported to be parallel to the X-Y plane is reflected by a first reflecting surface 52a of a prism 52 in the X direction. The light is then incident on a positive lens 53. The light transmitted through the positive lens 53 is reflected by the reflecting surface of the concave reflecting mirror 54 arranged to be coaxial with the positive lens 53, and incident on the positive lens 53 again. Note that since the concave reflecting mirror 54 is positioned to the focal position of the positive lens 53, the position of the concave reflecting mirror 54 corresponds to the position of an aperture stop.

The light transmitted through the positive lens 53 is reflected by a second reflecting surface 52b of the prism 52 in the Z direction. Thereafter, an intermediate image of the pattern on the mask 101 is formed between the first and second partial optical systems. Note that the field stop 55 is placed at the position where the intermediate image is formed. The light from the intermediate image passes through the field stop 55 and is reflected by a first reflecting surface 56a of the prism 56 in the X direction. The light is then incident on the positive lens 57.

The light transmitted through the positive lens 57 is reflected by the reflecting surface of the concave reflecting mirror 58 placed to be coaxial with the positive lens 57. The light is then incident on the positive lens 57 again. Note that since the concave reflecting mirror 58 is positioned to the focal position of the positive lens 57, the position of the concave reflecting mirror 58 corresponds to the position of an aperture stop.

The light transmitted through the positive lens 57 is reflected by a second reflecting surface 56b of the prism 56 in the Z direction and reaches the plate 102. In this manner, a secondary image of the pattern on the 15 mask 101 is formed as a one-to-one erect image on the plate 102.

As described above, the prism 52, the positive lens 53, and the concave reflecting mirror 54 constitute the first partial optical system for forming an intermediate image of a mask pattern. The prism 56, the positive lens 57, and the concave reflecting mirror 58 constitute the second partial optical system for re-forming a light image from the intermediate image of the mask pattern on the plate 102. The first and second partial optical systems constitute the projection optical system for forming a one-to-one erect image of a mask pattern on a plate.

The plate 102 is supported on a stage 103, which can move in the X and Z directions, to be parallel to the X-Y plane. The mask 101 is also supported on a stage 104, which can move in the X direction, to be parallel to the X-Y plane. Therefore, the pattern formed on the mask 101 can be scanned/exposed on the entire exposure region on the plate 102 altogether by moving the mask 101 and the plate 102, as an integral part, in the X direction (scanning direction) relatively to the projection optical system.

In the second embodiment, leakage light transmitted through the concave reflecting mirror 58 is detected by a photodetector 59, and an output signal from the photodetector 59 is supplied to a control system 62. The control system 62 obtains the focal position variation amount of the projection optical system by referring to a data table 61 indicating the relationship between the amount of leakage light and the focal position variation amount of the projection optical system in accordance with the output signal from the photodetector 59.

The data table 61 is formed in the same manner as in the first embodiment.

The control system 62 supplies a driving signal to a driving system 63 on the basis of the obtained focal position variation amount, and moves the stage 103, i.e., the plate 102, by a required amount in the Z direction in accordance with the driving signal. In this manner, the in-focus state between the mask 101, the plate 102, and the projection optical system can be adjusted to correct the variation in the focal position of the projection optical system which is caused by absorption of exposure light by the positive lenses 53 and 57.

In the second embodiment as well, the projection optical system is a two-side telecentric optical system. Therefore, the in-focus state with respect to the projection optical system can also be adjusted by moving the mask 101 in the Z direction. In addition, by moving both the mask 101 and the plate 102 in the Z direction, the in-focus state with respect to the projection optical system can be adjusted.

Furthermore, the focal position of the projection optical system may be adjusted to correct a variation in the focal position of the projection optical system which is caused by absorption of exposure light by the positive lenses 53 and 57.

Figure 3:
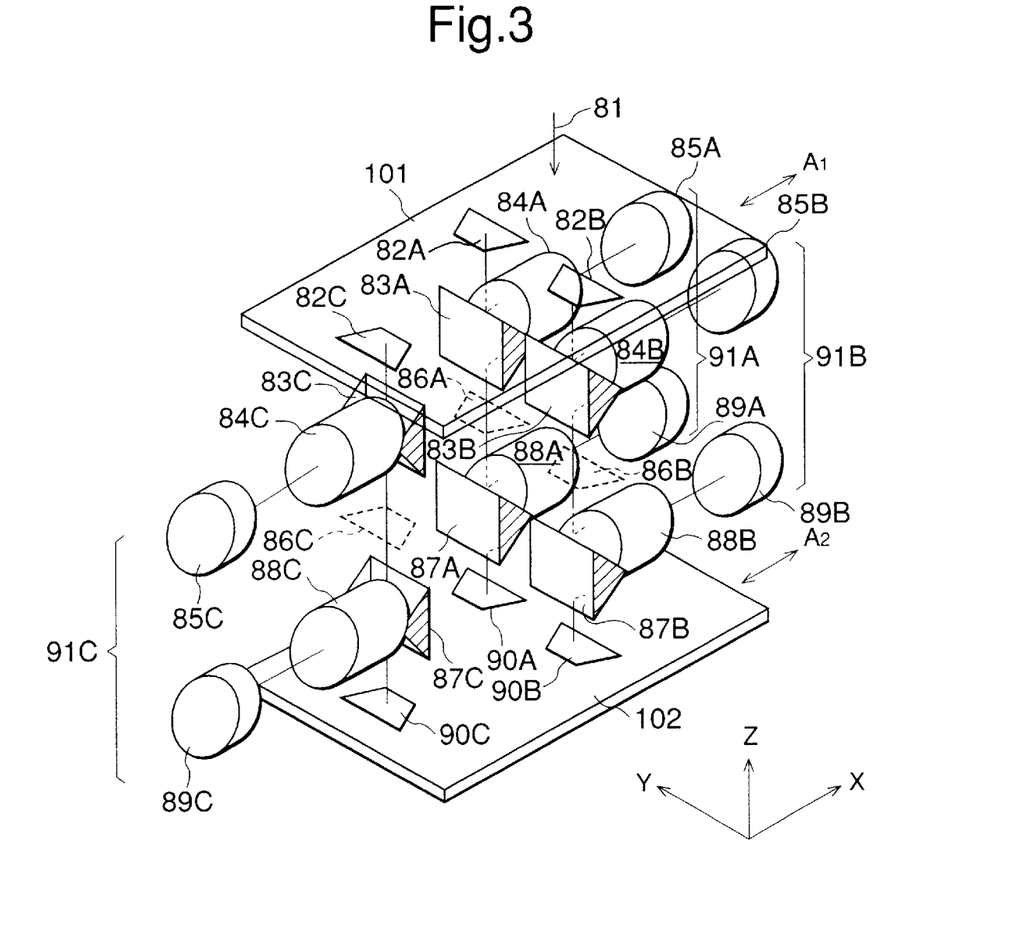
FIG. 3 is a perspective view showing the arrangement of a projection exposure apparatus according to the third embodiment of the present invention.

FIG. 3 is a perspective view showing the arrangement of a projection exposure apparatus according to the third embodiment of the present invention. In the third embodiment, a projection optical system is constituted by a plurality of (three in this case) one-to-one erect projection optical units each constituted by two partial optical systems and shown in FIG. 2.

Referring to FIG. 3, a direction (scanning direction) in which a mask 101 on which a predetermined circuit pattern is formed and a plate 102 made of a glass substrate coated with a resist are integrally conveyed is defined as the X-axis; a direction perpendicular to the X-axis within the plane of the mask 101, the Y-axis; and a direction normal to the mask 101, the Z-axis.

The projection exposure apparatus in FIG. 3 includes an illumination optical system (not shown) for uniformly illuminating the mask 101 supported to be parallel to the X-Y plane. A projection optical system constituted by a plurality of projection optical units 91A to 91C is placed below the mask 101. Each of the projection optical units 91A to 91C is constituted by a first partial optical system (83A to 85A; 83B to 85B; 83C to 85C), a field stop (86A to 86C), and a second partial optical system (87A to 89A; 87B to 89B; 87C to 89C). The projection optical units 91A to 91C have the same arrangement. Below the projection optical system, the plate 102 is placed on a stage (not shown) to be almost parallel to the X-Y plane.

Referring to FIG. 3, visual field regions 82A to 82C are defined on the mask 101 by the field stops 86A to 86C respectively arranged for the projection optical units 91A to 91C. Images of the visual field regions 82A to 82C are formed as one-to-one erect images in exposure regions 90A to 90C on the plate 102 through the projection optical units 91A to 91C.

The projection optical units 91A and 91B are placed such that the visual field regions 82A and 82B are arranged in a line along the Y direction, i.e., a direction perpendicular to the scanning direction. The projection optical unit 91C is placed such that the visual field region 82C is spaced apart from the visual field regions 82A and 82B along the X direction.

In the third embodiment, illumination light from the illumination optical system is irradiated on the trapezoidal visual field region 82A (82B or 82C) on the mask 101 supported to be parallel to the X-Y plane. The exposure light transmitted through the trapezoidal visual field region 82A is reflected by the first reflecting surface of the prism 83A (83B or 83C) and incident on the positive lens 84A (84B or 84C). The light transmitted through the positive lens 84A (84B or 84C) is reflected by the concave reflecting mirror 85A (85B or 85C) and incident on the positive lens 84A (84B or 84C) again.

The light transmitted through the positive lens 84A (84B or 84C) is reflected by the second reflecting surface of the prism 83A (83B or 83C). Thereafter, an intermediate image of the visual field region 82A (82B or 82C) on the mask 101 is formed. The light from the intermediate image passes through the field stop 86A (86B or 86C) and is reflected by the first reflecting surface of the prism 87A (87B or 87C). The light is then incident on the positive lens 88A (88B or 88C).

The light transmitted through the positive lens 88A (88B or 88C) is reflected by the concave reflecting mirror 89A (89B or 89C) and incident on the positive lens 88A (88B or 88C) again. The light transmitted through the positive lens 88A (88B or 88C) is reflected by the second reflecting surface of the prism 87A (87B or 87C). Thereafter, a one-to-one erect image of the visual field region 82A (82B or 82C) is formed on the mask 101 on the plate 102.

The mask 101 and the plate 102 are supported on a stage (not shown) which can move in the X and Z directions. In the third embodiment, in an exposure process, the mask 101 and the plate 102 are integrally moved in the direction indicated by arrows A1 and A2 in FIG. 3 (X direction). With this operation, the pattern image on the mask 101 can be formed on a large exposure region on the entire surface of the plate 102 altogether by one scanning exposure operation through plurality of projection optical units.

Figure 4:
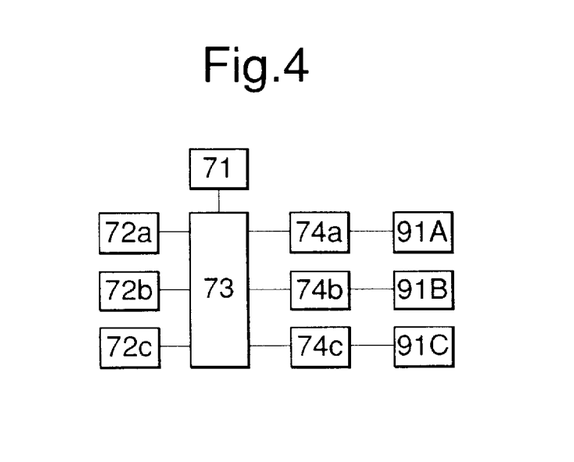
FIG. 4 is a block diagram showing a control system in the third embodiment of the present invention.

FIG. 4 is a block diagram showing a control system in the third embodiment.

In the third embodiment, leakage light transmitted through the concave reflecting mirrors 89A to 89C (or 85A to 85C) is detected by photodetectors 72a to 72c. Output signals from the photodetectors 72a to 72c are supplied to a control system 73. The control system 73 obtains the focal position variation amounts of the projection optical units 91A to 91C by referring to a data table 71 indicating the relationship between the amount of leakage light and the focal position variation amount of the projection optical system in accordance with the output signals from the photodetectors 72a to 72c. The data table 71 is formed in the same manner as in the first embodiment.

The control system 73 supplies driving signals to driving systems 74a to 74c on the basis of the obtained focal position variation amounts. The driving systems 74a to 74c adjust the focal positions of the projection optical units 91A to 91C in accordance with the driving signals, thereby correcting variations in the focal positions of the respective projection optical units 91A to 91C which are caused by absorption of exposure light by the positive lenses 84A to 84C and 88A to 88C in the projection optical units 91A to 91C.

In the third embodiment, the in-focus state of the projection optical system may be adjusted by moving the plate 102 or the mask 101 to the average focal position of the projection optical units 91A to 91C.

Figure 5:
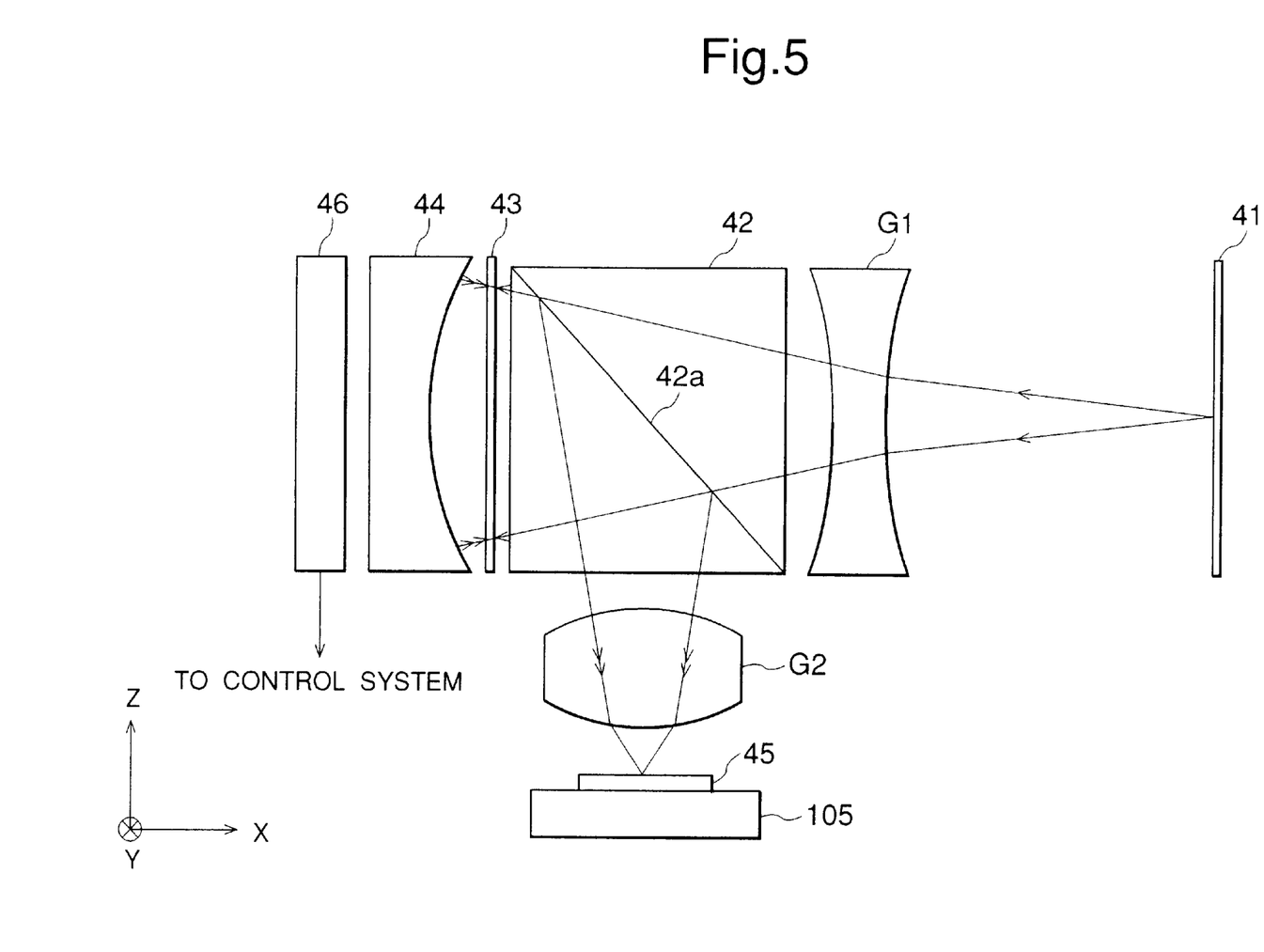
FIG. 5 is a view showing the showing the arrangement of a projection exposure apparatus according to the fourth embodiment of the present invention.

FIG. 5 shows the arrangement of a projection exposure apparatus according to the fourth embodiment of the present invention. In the first to third embodiments, a one-to-one image of a mask pattern is formed on a substrate (plate). In contrast to this, in the fourth embodiment, a reduced image of a mask pattern is formed on a substrate (wafer). That is, the projection exposure apparatus of the fourth embodiment includes a so-called reducing projection optical system.

The projection exposure apparatus in FIG. 5 includes an illumination optical system (not shown) for illuminating a mask 41 on which a transfer pattern is formed. Exposure light transmitted through the mask 41 supported to be parallel to the Y-Z plane is incident on a beam splitter 42 through a negative lens group G1. The light transmitted through a joint surface 42a of the beam splitter 42 is incident on a concave reflecting mirror 44 through a 4/λ plate 43. The light reflected by the reflecting surface of the concave reflecting mirror 44 is incident on the beam splitter 42 through the 4/λ plate 43.

The light reflected by the joint surface 42a of the beam splitter 42 downward in FIG. 5 passes through a positive lens group G2 to form a reduced image of the pattern on the mask 41 onto the wafer 45 supported to be parallel to the X-Y plane.

As described above, the negative lens group G1, the beam splitter 42, the 4/λ plate 43, the concave reflecting mirror 44, and the positive lens group G2 constitute a projection optical system for forming a reduced image of a mask pattern on a wafer.

The wafer 45 is supported on a stage 105 which can move within the X-Y plane. A mask pattern can be transferred onto each exposure region of the wafer 45 by sequentially exposing the wafer 45 while two-dimensionally and properly moving the stage 105, i.e., the wafer 45, within the x-Y plane.

In the fourth embodiment, leakage light transmitted through the concave reflecting mirror 44 is detected by a photodetector 46, and an output signal from the photodetector 46 is supplied to a control system (not shown). The control system obtains the focal position variation amount of the projection optical system in accordance with the output signal from the photodetector 46 by referring to a data table indicating the relationship between the amount of leakage light and the focal position variation amount of the projection optical system. In this manner, the in-focus state between the mask 41, the wafer 45, and the projection optical system can be adjusted to correct the variation in the focal position of the projection optical system which is caused by absorption of exposure light by the negative lens group G1 and the positive lens group G2. The data table is formed in the same manner as in the first embodiment.

Figure 6:
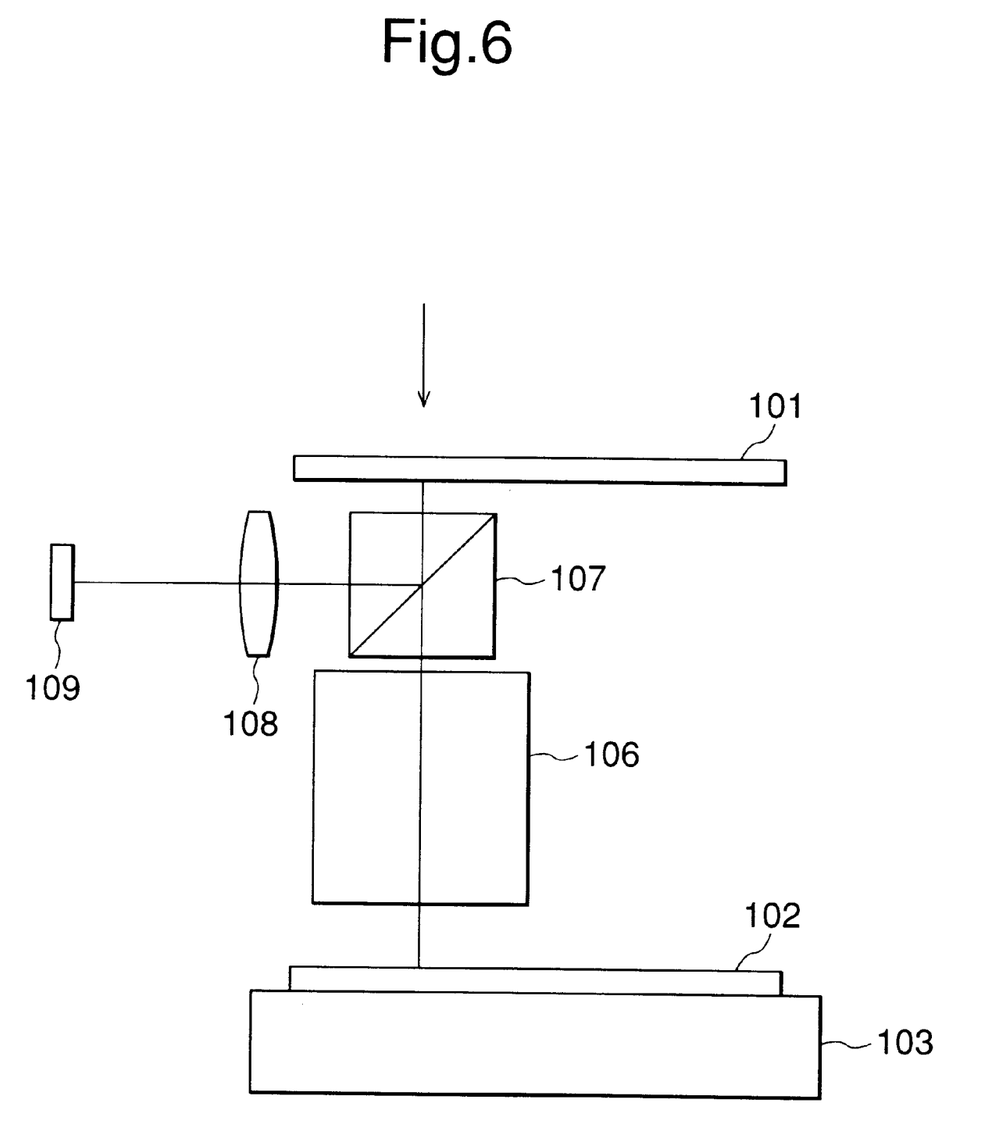
FIG. 6 is a view showing the showing the arrangement of a projection exposure apparatus according to the fifth embodiment of the present invention.

FIG. 6 shows the arrangement of a projection exposure apparatus according to the fifth embodiment of the present invention. This projection exposure apparatus does not use any reflection optical system such as a reflecting mirror. A half prism 107 is used to detect the amount of light transmitted through a refraction system in a projection optical system 106. Since light from an illumination optical system (not shown) is incident on the projection optical system 106 through the half the half prism 107, a predetermined ratio of light, of the amount of light incident on the projection optical system 106, can be reflected and split by the half prism 107. The split light is guided to a photodetector 109 through a lens 108, and the light amount is detected by the photodetector 109. An output signal from the photodetector 109 is supplied to a control system (not shown). The control system obtains the focal position variation amount of the projection optical system 106 in accordance with the output signal from the photodetector 109 by referring to a data table indicating the relationship between the amount of split light and the focal position variation amount of the projection optical system 106. In this manner, the in-focus state between a mask 101, a plate 102, and the projection optical system 106 can be adjusted to correct a variation in the focal position of the projection optical system 106. The data table is formed in the same manner as in the first embodiment.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 286431/1995 filed on Oct. 6, 1995 is hereby incorporated by reference.

What is claimed is:

1. A projection exposure apparatus for projecting and transferring a pattern formed on a first substrate onto a second substrate, comprising:

an illumination optical system for illuminating the first substrate;

a projection optical system for forming an image of the pattern formed on the first substrate on the second substrate, said projection optical system including a refraction system having a positive refracting power and a reflecting mirror placed to be coaxial with said refraction system;

a photodetector for detecting light, of light emitted from said illumination optical system and transmitted through the first substrate, which is transmitted through said reflecting mirror; and an adjustment mechanism for adjusting in-focus states between the first substrate and said projection optical system and between the second substrate and said projection optical system in accordance with an output from said photodetector.

2. An apparatus according to claim 1, wherein said adjustment mechanism moves at least one of the first and second substrates relatively to said projection optical system in accordance with a variation in focal position of said projection optical system which is obtained on the basis of the output from said photodetector.

3. An apparatus according to claim 1, wherein said adjustment mechanism adjusts the focal position of said projection optical system in accordance with the variation in the focal position of said projection optical system which is obtained on the basis of the output from said photodetector.

4. An apparatus according to claim 1, wherein said projection optical system comprises a first partial optical system for forming an intermediate image of a pattern on the first substrate, and a second partial optical system for forming a secondary image of the pattern on the second substrate on the basis of light from the intermediate image, each of said first and second partial optical systems comprises a refraction system having a positive refracting power and a reflecting mirror placed to be coaxial with said refraction system, and said photodetector detects light transmitted through at least one of said reflecting mirrors of said first and second partial optical systems.

5. An apparatus according to claim 1, wherein said projection optical system comprises a plurality of telecentric projection optical units for forming a one-to-one image of the pattern formed on the first substrate on the second substrate, each of said plurality of projection optical units comprises a refraction system having a positive refracting power and a reflecting mirror placed to be coaxial with said refraction system, said photodetector detects light transmitted through each of the reflecting mirrors of said plurality of projection optical units, and the first and second substrates are moved relatively to said projection optical system to project and transfer the pattern formed on the first substrate onto the second substrate through said projection optical system.

6. An apparatus according to claim 5, wherein said adjustment mechanism positions at least one of the first and second substrates to an average focal position of all said projection optical units.

7. An apparatus according to claim 5, wherein said adjustment mechanism adjusts a focal position of each of said projection optical units.

8. An apparatus according to claim 5, wherein said projection optical unit comprises a first partial optical system for forming an intermediate image of the pattern on the first substrate, and a second partial optical system for forming a secondary image of the pattern on the second substrate on the basis of light from the intermediate image, said refraction system and said reflecting mirror are provided for each of said first and second partial optical systems, and said photodetector detects light transmitted through at least one of said reflecting mirrors of said first and second partial optical systems.

9. An apparatus according to claim 1, wherein said projection optical system forms a substantially one-to-one image of the pattern formed on the first substrate on the second substrate.

10. An apparatus according to claim 1, wherein said projection optical system forms a reduced image of the pattern formed on the first substrate on the second substrate.

11. An apparatus according to claim 1, wherein a reflecting surface of said reflecting mirror is made of a dielectric multilayered film.

12. An apparatus according to claim 11, wherein the dielectric multilayered film is made of a combination of ZnS and $Na_3AlF_6$.

13. A projection exposure apparatus for projecting and transferring a pattern formed on a first substrate onto a second substrate, comprising:

an illumination optical system for illuminating the first substrate;

a projection optical system for forming an image of the pattern formed on the first substrate on the second substrate, said projection optical system including a refraction system having a positive refracting power;

a light dividing member arranged between said first and second substrates for picking up a part of light from said illumination optical system;

a photodetector for detecting the light split by said light dividing member; and an adjustment mechanism for adjusting in-focus states between the first substrate and said projection optical system and between the second substrate and said projection optical system in accordance with an output from said photodetector.

14. A method using a projection exposure apparatus for projecting and transferring a pattern formed on a first substrate onto a second substrate, comprising the steps of:

illuminating, with an illumination optical system, the first substrate;

forming, with a projection optical system, an image of the pattern formed on the first substrate on the second substrate, said projection optical system including a refraction system having a positive refracting power and a reflecting mirror placed to be coaxial with said refraction system;

detecting, with a photodetector, light emitted from said illumination optical system and transmitted through the first substrate and transmitted through said reflecting mirror;

adjusting, with an adjustment mechanism, in-focus states between the first substrate and said projection optical system and between the second substrate and said projection optical system in accordance with an output from said photodetector, wherein said projection optical system comprises a first partial optical system for forming an intermediate image of a pattern on the first substrate, and a second partial optical system for forming a secondary image of the pattern on the second substrate on the basis of light from the intermediate image, each of said first and second partial optical systems comprises a refraction system having a positive refracting power and a reflecting mirror placed to be coaxial with said refraction system, and said photodetector detects light transmitted through at least one of said reflecting mirrors of said first and second partial optical systems.

15. A method using a projection exposure apparatus for projecting and transferring a pattern formed on a first substrate onto a second substrate, comprising the steps of:

illuminating, with an illumination optical system, the first substrate;

forming, with a projection optical system, an image of the pattern formed on the first substrate on the second substrate, said projection optical system including a refraction system having a positive refracting power and a reflecting mirror placed to be coaxial with said refraction system;

detecting, with a photodetector, light emitted from said illumination optical system and transmitted through the first substrate and transmitted through said reflecting mirror;

adjusting, with an adjustment mechanism, in-focus states between the first substrate and said projection optical system and between the second substrate and said projection optical system in accordance with an output from said photodetector, wherein said projection optical system comprises a plurality of telecentric projection optical units for forming a one-to-one image of the pattern formed on the first substrate on the second substrate, each of said plurality of projection optical units comprises a refraction system having a positive refracting power and a reflecting mirror placed to be coaxial with said refraction system, said photodetector detects light transmitted through each of the reflecting mirrors of said plurality of projection optical units, and the first and second substrates are moved relatively to said projection optical system to project and transfer the pattern formed on the first substrate onto the second substrate through said projection optical system.

16. A method using a projection exposure apparatus according to claim 15, said method comprising the steps of:

illuminating the first substrate by said illumination optical system; and transferring a pattern image of the first substrate on the second substrate.

17. A method using a projection exposure apparatus according to claim 16, wherein said adjustment mechanism adjusts a focal position of each of said projection optical units; and transferring a pattern image of the first substrate on the second substrate.

18. A method using a projection exposure apparatus for projecting and transferring a pattern formed on a first substrate onto a second substrate, comprising the steps of:

illuminating, with an illumination optical system, the first substrate;

forming, with a projection optical system, an image of the pattern formed on the first substrate on the second substrate, said projection optical system including a refraction system having a positive refracting power;

picking-up, with a light dividing member arranged between said first and second substrates, a part of light from said illumination optical system;

detecting, with a photodetector, the light split by said light dividing member;

adjusting, with an adjustment mechanism, in-focus states between the first substrate and said projection optical system and between the second substrate and said projection optical system in accordance with an output from said photodetector.

19. A projection exposure apparatus for projecting and transferring pattern formed on a first substrate onto a second substrate, comprising:

an illumination optical system for forming an image of the pattern formed on the first substrate on the second substrate, a projection optical system including a refraction system having a positive refracting power;

a light dividing member arranged between said first and second substrates for picking up a part of light from said illumination optical system;

a photodetector for detecting the light split by said light dividing member; and an adjustment mechanism for adjusting in-focus states between the first substrate and said projection optical system and between the second substrate and said projection optical system in accordance with an output from said photodetector.

20. A method using a projection exposure apparatus for projecting and transferring a pattern formed on a first substrate onto a second substrate, comprising the steps of:

illuminating, with an illumination optical system, the first substrate;

forming, with a projection optical system, an image of the pattern formed on the first substrate on the second substrate, said projection optical system including a refraction system having a positive refracting power and a reflecting mirror placed to be coaxial with said refraction system;

detecting, with a photodetector, light emitted from said illumination optical system and transmitted through the first substrate and transmitted through said reflecting mirror;

adjusting, with an adjustment mechanism, in-focus states between the first substrate and said projection optical system and between the second substrate and said projection optical system in accordance with an output from said photodetector.

* * * * *